(12) United States Patent
Kettler, III et al.

(10) Patent No.: US 7,724,149 B2
(45) Date of Patent: May 25, 2010

(54) APPARATUS, AND ASSOCIATED METHOD, FOR SELECTING DISTRIBUTION OF PROCESSING TASKS AT A MULTI-PROCESSOR DATA CENTER

(75) Inventors: Edward W. Kettler, III, Plano, TX (US); Edward S. Reynolds, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 336 days.

(21) Appl. No.: 11/761,211

(22) Filed: Jun. 11, 2007

(65) Prior Publication Data

US 2008/0303676 A1 Dec. 11, 2008

(51) Int. Cl.
*G08B 17/00* (2006.01)
*G06F 1/00* (2006.01)
*G06F 15/173* (2006.01)

(52) U.S. Cl. .................. 340/584; 713/324; 709/240
(58) Field of Classification Search ............. 340/584, 340/593, 594; 713/300–340; 361/688–697; 709/240, 241
See application file for complete search history.

(56) References Cited

U.S. PATENT DOCUMENTS

| | | | | |
|---|---|---|---|---|
| 6,519,707 B2 * | 2/2003 | Clark et al. | | 713/322 |
| 7,275,012 B2 * | 9/2007 | Hermerding, II | | 702/136 |
| 7,349,762 B2 * | 3/2008 | Omizo et al. | | 700/278 |
| 2004/0075984 A1 | 4/2004 | Bash | | |
| 2004/0089009 A1 | 5/2004 | Bash | | |
| 2004/0255176 A1 * | 12/2004 | George et al. | | 713/320 |
| 2005/0086543 A1 * | 4/2005 | Manuell et al. | | 713/300 |
| 2006/0112286 A1 | 5/2006 | Whalley et al. | | |
| 2007/0067136 A1 * | 3/2007 | Conroy et al. | | 702/130 |
| 2008/0204999 A1 * | 8/2008 | Clidaras et al. | | 361/696 |

OTHER PUBLICATIONS

Sharma et al: "Balance of Power: Dynamic Thermal Management for Internet Data Centers" HPL-2003-05, [Online] Feb. 18, 2003, pp. 1-13, XP002498342.

Moore J et al: "A Sense of Place: Toward a Location-aware Information Plane for Data Centers" HP Labs Technical Report, XX, XX, Apr. 2, 2004, pp. 1-12, XP002351255.

* cited by examiner

*Primary Examiner*—Jennifer Mehmood

(57) ABSTRACT

Apparatus, and an associated method, for selecting at which processing unit of a plurality of processing units positioned at a data center that a processing task is to be performed. Temperature sensors are positioned throughout the data center and associated with the individual ones of the processing units. Indications of sensed temperature levels are collected and monitored by a collector and monitor. The indications of the sensed temperatures are used both pursuant to cooling operations, controlled by a cooling controller, and pursuant to processing-task placement, determined by a workload placement controller.

20 Claims, 3 Drawing Sheets

APPARATUS, AND ASSOCIATED METHOD, FOR SELECTING DISTRIBUTION OF PROCESSING TASKS AT A MULTI-PROCESSOR DATA CENTER

The present invention relates generally to a manner by which to distribute computer loading at a multi-processor data center. More particularly, the present invention relates to apparatus, and an associated method, by which to select at which processors to perform processing tasks depending upon various criteria, including temperature levels proximate to different ones of the processors of the data center.

By including temperature levels as part of the selection criteria, better distribution through the data center of heat generated as a by product of performance of processing tasks is achievable. Problems associated with hot spots in the data center are ameliorated or, at the least, are less likely to be aggravated.

BACKGROUND OF THE INVENTION

Advancements in digital processing and mass storage technologies have had profound impact upon many facets of modern society. Collection of data and its subsequent processing has many business, and other, applications. Storage capacities of storage devices permit storage of seemingly, ever-increasing amounts of data and processing capabilities of processing devices, permit increasingly-large amounts of data. Large amounts of data, once collected and stored, are easily accessible, available for ready processing thereof.

While portable and desk top computers exhibit storage capabilities and processing capacities that, just a few years ago, would have seemed astounding, data-center, computing systems are of correspondingly increased capacities and capabilities. Data-center systems are sometimes constructed to include multiple processing units, typically capable of concurrent, i.e., parallel, operation. The processing units are configured as part of, or have access to, storage servers that maintain large amounts of data.

A data center is typically created at an enclosed area at which ambient conditions are controlled. The control includes temperature control to maintain the temperatures, or place the temperatures, within an acceptable range of temperatures.

The processing units generate heat energy as a by product of their operation. Cooling devices, referred to herein as chillers, are positioned within the data center and operated, when needed or desired, to dissipate heat energy, including the heat energy generated during operation of the processing units. Cooling places or maintains the data center temperature beneath a maximum temperature of the allowable temperature range. When a data center is of even moderate dimensions, multiple chillers are regularly utilized. Different ones of the chillers are independently triggered. That is to say, the chillers are sometimes independently operable, turned on and off independently, when needed, or no longer needed, respectively. A chiller is typically controlled by a controller that triggers the chiller responsive to detected temperature levels detected by one or more temperature sensors, e.g., thermocouples, thermometers, or the like. If, any, or any group, of sensors associated with a chiller indicate that chilling operations are required, the associated chiller is caused to provide cooling, either for a selected time period or until the temperature sensor or sensors indicate that cooling is no longer required.

Particularly when the data center is of large dimensions, there is sometimes a temperature variance in different parts of the data center. That is to say, the ambient conditions are heterogeneous, and sometimes, some areas of the data center require cooling while other areas of the data center are not in need of cooling. Separate chillers are associated with separate or non-identical groups of temperature sensors, thereby separately to be triggered responsive to temperatures sensed by the separate temperature sensors or groups of temperature sensors.

As noted, the processing units generate heat energy during their operation. When a processing task is performed at the processing unit, increased amounts of heat energy are generated as a by product of the operation of the processing unit to perform the processing task. The heat energy generated as a result of performance of a processing task at a processing unit, or performance of processing tasks at a group of processing units positioned in proximity to one another, increases the possibility that a set point of a temperature sensor in proximity to the processing unit or group of processing units shall be triggered, thereby causing a cooling controller to cause an associated chiller to perform cooling operations. If a processing task were, however, instead performed at a different processing unit, the increase in temperature at the localized area of the group of processing units might not otherwise result.

While processing units positioned at a data center are controlled by a controller with respect to assignation of processing tasks, existing controllers typically do not take into account temperature levels within the data center when making the assignations.

If a manner could be provided by which to take into account the temperature levels at the data center when making the processing-task assignments, improved data center operations would be possible. Improved distribution of heat energy generated during operation of the processing units would thereby be possible.

It is in light of this background information related to data center processing operations that the significant improvements of the present invention have evolved.

SUMMARY OF THE INVENTION

The present invention, accordingly, advantageously provides apparatus, and an associated method, for distributing computer loading at a multi-processor data center.

Through operation of an embodiment of the present invention, a manner is provided by which to select at which processor to perform a processing task depending upon various criteria. The criteria upon which selection is based includes an indication of temperature levels proximate to different ones of the processors of the data center.

When indications of temperature levels at the data center are taken into account, as part of the selection criteria, better distribution of heat generated as a by-product of performance of the processing tasks at the processing units is attainable. Temperature hot spots in a data center, and problems resulting therefrom, are ameliorated, or less likely to occur.

In one aspect of the present invention, the data includes a plurality of temperature sensors, positioned at selected locations in the data center. The temperature sensors are associated with different ones of the processing units that are also positioned at the data center. Association is made between temperature sensors and processing units, e.g., by way of their proximities to one another or any other appropriate manner. A single temperature sensor is, e.g., associated with a single processing unit. Or, multiple temperature sensors are associated with a single processing unit. Or, a single temperature sensor is associated with multiple processing units.

In another aspect of the present invention, one or more chillers are positioned at the data center to provide cooling to the data center. When operated, a chiller provides cooling air flow to the data center to maintain or lower the temperature at the data center. Operation of a chiller is controlled by a cooling controller. When the data center includes multiple chillers, the chillers are, e.g., independently operated, or operated in unison. A temperature level sensed by a temperature sensor forms a trigger that the cooling controller uses to cause operation, i.e., turning on and turning off of a chiller. Chillers are also, e.g., positioned in proximity to a processing unit or a group of processing units, or are otherwise associated with the processing unit or group of processing units. Temperature levels sensed by temperature sensors also associated with the same processing unit or group of processing units are used by the cooling controller to control operation of the associated chiller. When multiple temperature sensors and multiple, independently-operated chillers are utilized, the cooling controller is able to provide cooling to selected parts of the data center on an as-needed basis.

In another aspect of the present invention, a data center monitor is provided that collects information of ambient conditions at the data center. When temperature sensors are positioned throughout the data center, the monitor, for instance, collects sensed temperature indications. And, monitored and collected indications are used, to maintain temperature levels at the data center within an allowable range. Sensed temperature levels are provided to a dynamic cooler controller that controls operation of chillers at the data center. Thereby, cooling air is caused to be provided to the data center to maintain the data center at temperature levels at, or beneath, a maximum allowable temperature.

In another aspect of the present invention, a workload placement selector selects placement of processing tasks to be performed at individual ones of the processing units positioned at the data center. Selection of at which of the processing unit or units to assign performance of a processing task is dependent upon various criteria.

Temperature levels sensed by temperature sensors at selected locations of the data center are amongst the criteria. The selection of the placement of the processing task, i.e., the workload, takes into account the temperature levels proximate to separate ones of the processing units. Selection of the placement of the processing task at a processing unit is made to assign its performance at a processing unit, if available, at a location of the data center at which temperature levels are not elevated.

Additional criteria used in the selection of the placement of the workload includes, for example, characteristics of the processing unit, characteristics of the processing task that is to be performed, availability of capacity, as well as any other appropriate selection criteria. Optimization algorithms are performable to take into account the overall environment, the past history of operations, current environmental conditions, power consumption goals and constraints, etc. Placement of the workload is further made to achieve better the business goals of the enterprise Thereby, improved selection of the placement of the processing task at a processing unit of a multi-processor data center is achievable.

In these and other aspects, therefore, apparatus, and an associated method, is provided for distributing processing load at a data center that has a plurality of processing units. Indications of thermal conditions associated with the processing units are detected. And, selection is made of at which of the processing units to perform a processing task. Selection is made responsive, at least in part, to the indications of the detected thermal conditions.

DETAILED DESCRIPTION

Figure 1:
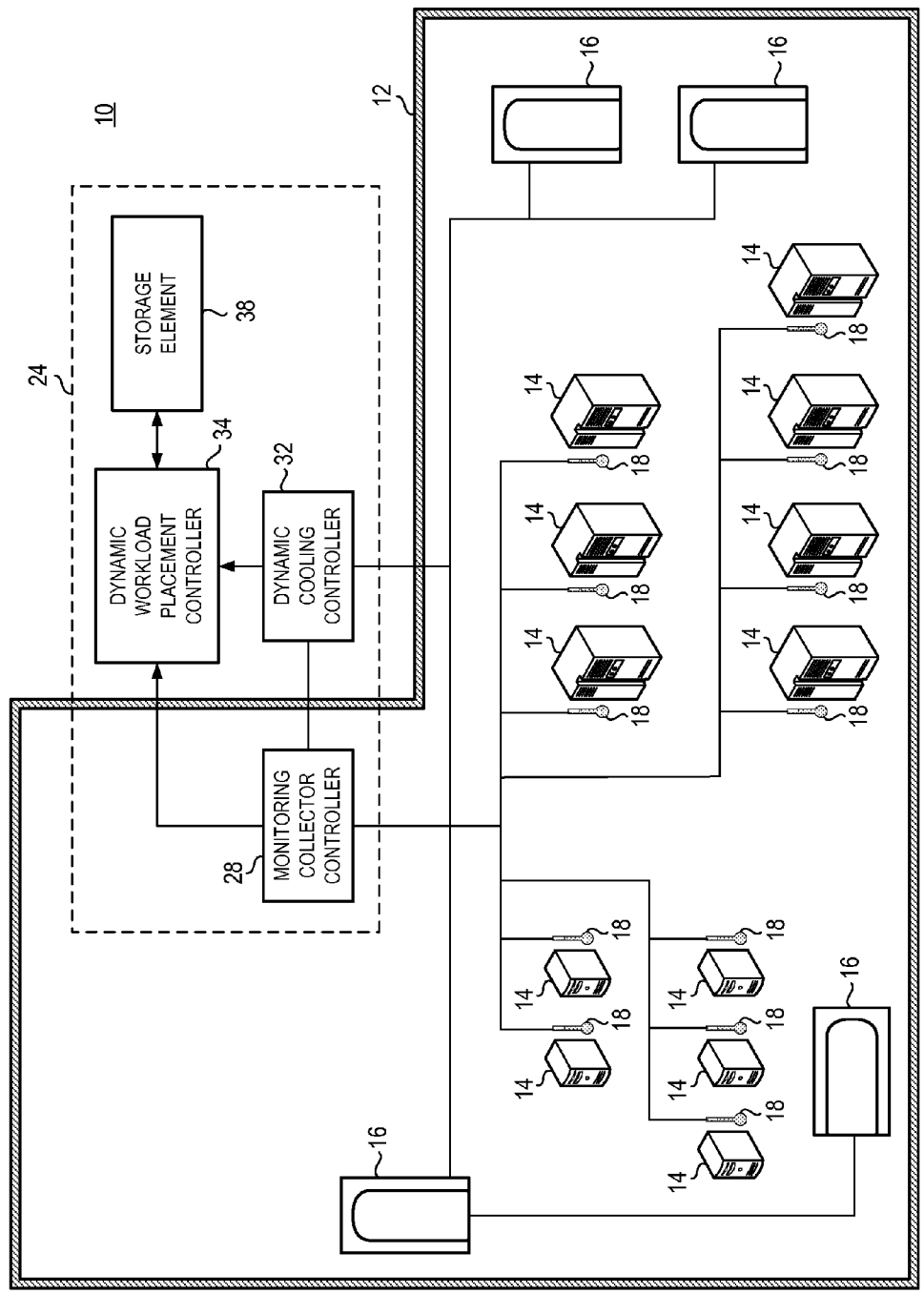
FIG. 1 illustrates a functional block diagram of an exemplary data center with which an embodiment of the present invention is operable.

Referring first to FIG. 1, a data center, shown generally at 10, provides a secure facility at which to position, maintain, and operate computer processors in a controlled, and secure, environment. The data center forms, for example, a building structure 12 within which the processing units 14 are positioned. The processing units are here positioned throughout the data center, appropriately supported and powered. Controlled access by way of communication lines (not separately shown) is provided to at least some of the processing units positioned at the data center.

The controlled environment of the data center includes control of the thermal environment therein. That is to say, the temperature levels at the data center are maintained within an allowable range of temperatures. If the temperature levels at the data center exceed a maximum allowable temperature, or fall beneath a minimum allowable temperature, temperature-altering operations are performed to place the data center back within the allowable temperature range.

The data center includes chillers 16 that provide coolant air to the enclosed area of the data center. The four chillers 16 shown in the figure are merely exemplary. Greater, or fewer, numbers of chillers are used in other exemplary implementations. In the exemplary implementation, the chillers 16 are independently operable. That is to say, the chillers are separately operated, i.e., turned-on and turned-off, thereby to permit cooling air to be provided to portions, rather than the entire, data center by operating individual ones of the chillers.

Temperature levels at the data center are monitored through the placement of temperature sensors 18 throughout the data center. The temperature sensors are, in the exemplary implementation, positioned in proximity to different ones of the processing units 14 to be associated therewith. The temperature sensors are formed, for instance, of thermometers having set points or are formed of thermocouples that trigger at selected temperatures. Through appropriate positioning of the temperature sensors, indications of the temperature levels at different parts of the data center are ascertained. And, by associating different temperature sensors with different processing units, indications of temperature levels formed by the temperature sensors are also indicative of ambient temperature levels about the individual ones of the processing units. The temperature sensors are of numbers to provide a one-to-one ratio, or alternately, are of numbers defining larger or smaller ratios.

FIG. 1 further illustrates an apparatus 24 of an embodiment of the present invention. The apparatus is formed of functional elements, implementable in any desired manner, including algorithms executable by processing circuitry or hardware equivalents thereof. The apparatus is here shown to include parts that are within the confines of the data center and other parts that are positioned beyond the data center. In other implementations, other arrangements are formed. That is to say, the elements of the apparatus are alternately positionable entirely within the data center or entirely beyond the data center.

The apparatus includes a monitor and sensed temperature indication collector 28. The monitor and collector are connected in communication connectivity with the temperature sensors 18. The sensors are monitored, and sensed temperature indications are collected. The collected information includes information pertaining to temperature levels and occurrences of temperature levels that are beyond threshold. When, for instance, a temperature sensor senses that the ambient temperature thereabout exceeds a maximum, allowable level, an indication is provided to the monitor and collector. Indications are collected by the monitor and collector 28 and are provided to a cooling controller 32 and to a workload placement controller 34. The indications are provided, for instance, continuously, or at selected intervals, or on an as-needed basis.

The cooling controller is dynamically operable to control operation of the chillers 16. Different ones of the temperature sensors, positioned at different parts of the data center are additionally associated with different ones of the chillers. Responsive to sensed temperature indications provided to the cooling controller by way of the monitor and collector, an appropriate chiller is caused to be operated. And, when cooling air is no longer required, the cooling controller turns off the chiller so that additional cooling air is no longer provided. As updates are provided to the cooling controller, updated control operations are commanded by the controller. Cooling control information is also provided to the workload placement controller 34.

The workload placement controller controls the assignation of processing tasks to the processing units 14. Pursuant to an embodiment of the present invention, various criteria are considered by the workload placement controller in the selection of with which of the processing units that processing tasks are assigned. Included amongst the criteria are sensed temperature indications collected by the monitor and collector 28. The collected information is used in combination with, or alone, to select to where to assign a processing task.

Heat energy is generated during performance of a processing task at a processing unit. If the processing unit is located at a part of the data center that the sensed temperature indications identify as too hot, i.e., close to or exceeding, the allowable maximum temperature of the allowable temperature range, the workload placement controller operates to exclude the processing units so-situated from availability of assignment to perform the processing task. Additional criteria are also utilized in the selection of assignment. Processing-unit loading, on a historical basis, present-state basis, or prospective basis is amongst the additional criteria. The apparatus is further shown to include a storage element 38 at which information related to past usage of the processing units is stored. Additional information used by the workload placement controller in the selection process is also storable at the storage element 38.

Additional criteria considered by the workload placement controller in the assignation of processing tasks to be performed by processing units include, for instance, the platform characteristics of the individual processing units, availability of capacity at the individual ones of the processing units, the overall environment at the data center, past history of the workloads, current environmental conditions, current workload conditions, power consumption goals and constraints, and workplace assignations that optimize achievement of business goals of the enterprise.

In various implementations, various weightings are applied to the various criteria. For instance, if a criteria is not to be considered, the criteria is given a zero weighting. And, if a criteria is required in order for a processing unit to be assigned to perform the processing task, then the succession algorithm is correspondingly adjusted to ensure that the processing task is assigned to an appropriate processing unit.

Figure 2:
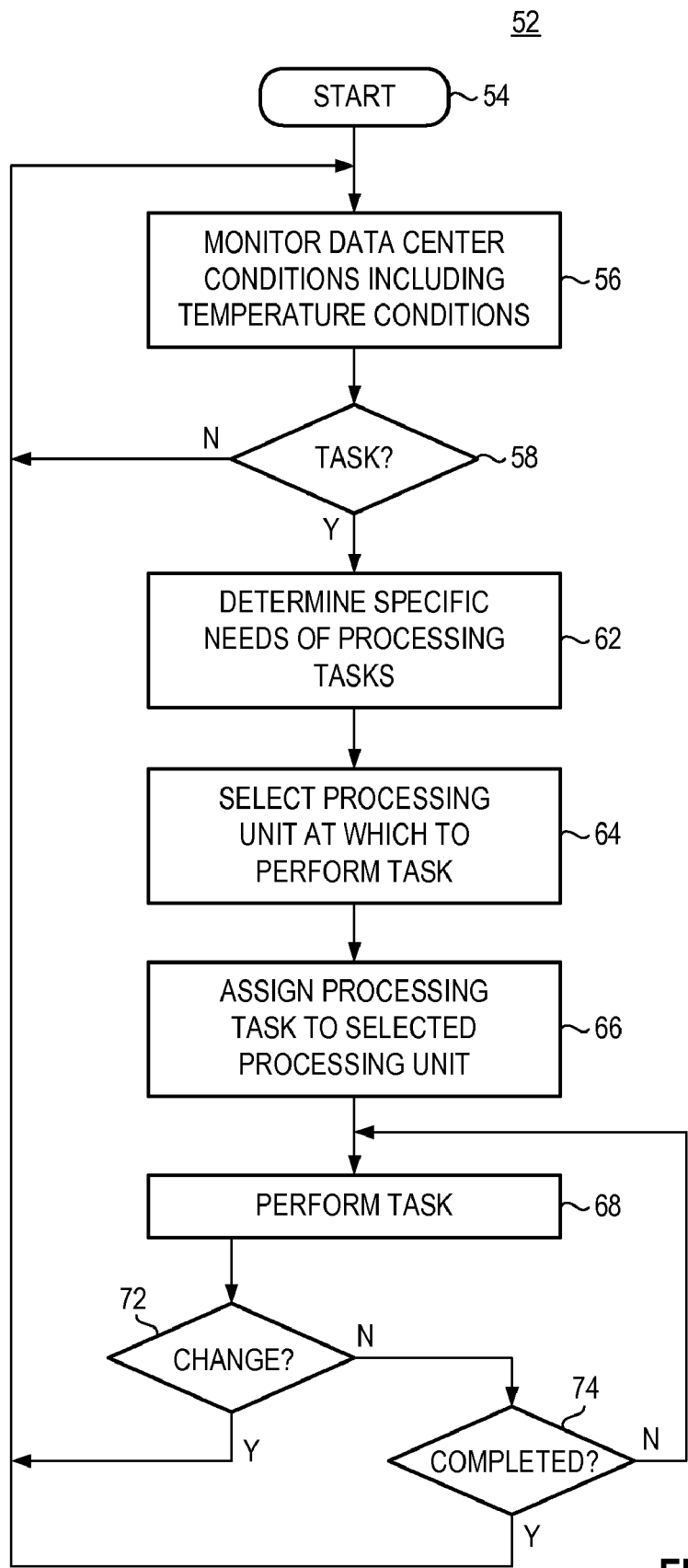
FIG. 2 illustrates a process diagram representative of the process of operation of an embodiment of the present invention.

FIG. 2 illustrates a process, shown generally at 52, representative of the process of operation of an embodiment of the present invention. The process is carried out pursuant to selection of a processing unit, or units, at which to assign a processing task or tasks. First, after entry indicated by the start block 54, data center conditions are monitored, as indicated by the block 56. The conditions include temperature conditions associated with processing units at parts of the data center.

Then, at the decision block 58, a determination is made as to whether a processing task is to be performed. If not, the no branch is taken back to the block 56. Otherwise, the yes branch is taken from the decision block 58 to the block 62. At the block 62, determination is made of specific needs of the processing task that is to be performed. Then, as indicated by the block 64, selection is made of the processing unit or units to which the processing task shall be assigned for its performance. Criteria used by which to make selection includes indications of sensed temperature conditions associated with the individual ones of the processing units at the data center.

Once selection is made, the processing task is assigned to the selected processing unit or units. And, as indicated by the block 68, the processing task is performed.

In a further implementation, if, during performance of the processing task, conditions have changed, reassignment of the processing unit is made. In the process 52 shown in FIG. 2, a decision block 72 is used. If conditions are determined to have been changed, the yes branch is taken back to the block 64. If conditions have not changed, a no branch is taken to the decision block 74. At the decision block 74, a determination is made as to whether the task is completed. If so, the yes branch is taken back to the block 56. Otherwise, the no branch is taken back to the block 68.

Thereby, processing task assignations are made by taking into account the temperature conditions at the data center.

Figure 3:
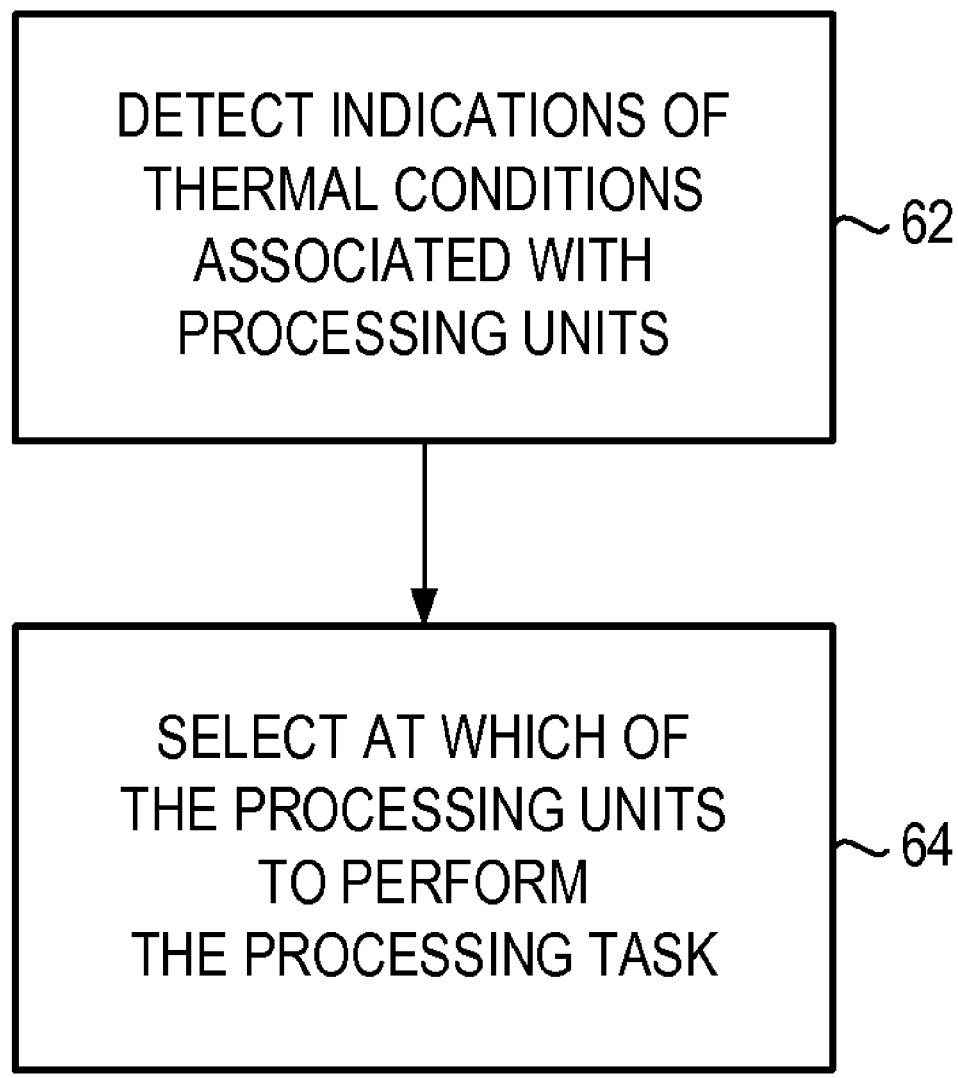
FIG. 3 illustrates a method flow diagram representative of the method of operation of an embodiment of the present invention.

FIG. 3 illustrates a method flow diagram, shown generally at 92, representative of the method of operation of an embodiment of the present invention. The method distributes processing load at a data center having a plurality of processing units.

First, and as indicated by the block 94, indications of thermal conditions associated with the processing units are detected. Then, and as indicated by the block 96, selection is made of at which of the processing units to perform a processing task. Selection is responsive, at least in part, to the indications of the sensed thermal conditions.

Thereby, by taking into account, sensed temperature levels at parts of the data center, selection of the processing unit at which to perform a processing task is better made. A better heat distribution at the data center is thereby achievable.

What is claimed is:

1. A method for distributing processing load at a data center having a plurality of processing units, said method comprising the operations of:

detecting indications of different thermal conditions respectively associated with different ones of the processing units; and selecting at which of the processing units to perform an impending processing task responsive, at least in part, to differences between the indications of the thermal conditions detected during said operation of detecting;

wherein the selecting includes identifying a processing unit associated with a lower detected temperature than other of the processing units to perform the processing task.

2. The method of claim 1 wherein the processing task requires at least a minimum processing level, and wherein selection during said operation of selecting at which of the processing units to perform the processing task is further responsive to availability of the level of processing capacity of each processing unit.

3. The method of claim 1 further comprising the operation of detecting indications of processing-unit processing utilization level at each of the plurality of processing units.

4. The method of claim 3 wherein said operation of selecting is further responsive to the indications of the processing-unit processing utilization level detected during said operation of detecting the indications of the processing-unit processing utilization.

5. The method of claim 3 wherein the indications of the processing-unit processing utilization level detected during said operation of detecting the indications of the processing-unit processing utilization level comprises indications of present processing-unit processing utilization level.

6. The method of claim 3 wherein the indications of the processing-unit utilization level detected during said operation of detecting the indications of the processing-unit processing utilization comprises indications of anticipated processing-unit processing utilization level.

7. The method of claim 3 wherein the indications of the processing-unit utilization level detected during said operation of detecting the indications of the processing-unit processing utilization comprises indications of historical processing-unit processing utilization level.

8. The method of claim 1 wherein the processing units are constrained by maximum power consumption levels and wherein selection made during said operation of selecting is further made responsive to the maximum power consumption levels.

9. The method of claim 1 wherein the selecting further includes excluding a processing unit associated with a detected temperature exceeding an allowable maximum temperature from performing the processing task.

10. The method of claim 1 wherein the processing units are operated in conformity with enterprise aspirational goals and wherein said operation of selecting is further responsive to the enterprise aspirational goals.

11. The method of claim 1 further comprising performing said operations of detecting and selecting with regard to an executing processing task.

12. Apparatus for distributing processing load at a data center having a plurality of processing units, said apparatus comprising:

a thermal sensor monitor associated with the processing units, said thermal sensor monitor configured to detect indications of different thermal conditions in proximity to different ones of the processing units; and a selector adapted to receive indications of the thermal conditions detected by said thermal sensor monitor, said selector configured to select at which of the processing units to perform an impending processing task, selection made responsive, at least in part, to differences between the indications of the thermal conditions detected by said thermal sensor monitor, and to identify a processing unit associated with a lower detected temperature than other of the processing units to perform the processing task.

13. The apparatus of claim 12 wherein said thermal sensor monitor further comprises a plurality of thermal sensors that each sense thermal conditions, each thermal sensor associated with a processing unit of the plurality of processing units.

14. The apparatus of claim 12 wherein the processing task requires at least a minimum processing level and wherein selection made by said selector is further responsive to availability of the level of processing capacity of each processing unit.

15. The apparatus of claim 12 further comprising a processing utilization detector configured to detect processing utilization of processing capacities of the processing units and wherein selection made by said selector is further responsive to detected levels of the processing utilization of the processing capabilities of the processing units.

16. The apparatus of claim 15 further comprising a storage entity configured to store indications of levels of the processing utilizations of the processing capacities of the processing units and wherein selection made by said selector is further responsive to the indications of the levels of the processing utilizations stored at said storage entity.

17. The apparatus of claim 16 wherein the levels of the processing indications stored at said storage entity comprise indications of prior levels of processing utilizations.

18. The apparatus of claim 15 further comprising a storage entity configured to store indications of processing capabilities of the processing units and wherein selection made by said selector is further responsive to the indications of the processing capabilities of the processing units stored at said storage entity.

19. The apparatus of claim 14 further comprising a storage entity configured to store indications of maximum power consumption levels at which the processing units are permitted to be operated and wherein selection made by said selector is further responsive to the maximum power consumption levels at which the processing units are permitted to be operated.

20. Apparatus for balancing air temperature distribution at a data center at which processing units are operable, said apparatus comprising:

a collector configured to collect indications of temperature levels at a plurality of locations at the data center;

a dynamic workload placement selector configured to select placement of an impending work task at the processing units responsive, in part, to the indications collected by said collector, and to balance the air temperature distribution by placing the work task to increase the heat generated at a selected location having lower temperature than other of the locations; and a dynamic cooling selector configured to select cooling at the data center responsive, in part to the indications collected by said collector.

* * * * *